United States Patent
Yamashita et al.

(10) Patent No.: US 7,589,531 B2
(45) Date of Patent: Sep. 15, 2009

(54) GRADIENT MAGNETIC FIELD COIL UNIT, GANTRY FOR MRI APPARATUS, AND MRI APPARATUS

(75) Inventors: Masatoshi Yamashita, Otawara (JP); Hiromitsu Takamori, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 11/958,776

(22) Filed: Dec. 18, 2007

(65) Prior Publication Data
US 2008/0169813 A1    Jul. 17, 2008

(30) Foreign Application Priority Data

Jan. 17, 2007   (JP)   ............................. 2007-008123
Nov. 15, 2007   (JP)   ............................. 2007-296967

(51) Int. Cl.
*G01V 3/00*   (2006.01)

(52) U.S. Cl. ...................................... 324/318; 324/322

(58) Field of Classification Search ......... 324/300–322; 336/302, 216, 219, 297; 128/653.2, 653.5
See application file for complete search history.

(56) References Cited

U.S. PATENT DOCUMENTS

| | | | | |
|---|---|---|---|---|
| 5,786,695 | A | * | 7/1998 | Amor et al. .................. 324/320 |
| 6,011,394 | A | * | 1/2000 | Petropoulos et al. ........ 324/318 |
| 7,397,244 | B2 | * | 7/2008 | Cirel ........................... 324/318 |
| 2007/0247156 | A1 | * | 10/2007 | Schuster et al. ............. 324/318 |
| 2007/0268021 | A1 | * | 11/2007 | Sakakura .................... 324/318 |

FOREIGN PATENT DOCUMENTS

JP      2006-311957      11/2006

* cited by examiner

*Primary Examiner*—Brij B Shrivastav
(74) *Attorney, Agent, or Firm*—Nixon & Vanderhye PC (57) ABSTRACT

A gradient magnetic field coil unit includes a main coil layer that has a main coil for generating a gradient magnetic field and is formed in a substantially cylindrical shape. A shield coil layer that is attached to the outside of the main coil layer and has a shield coil for generating a magnetic field which shields a leakage magnetic field from the main coil. A cooling layer is attached between the main coil layer and the shield coil layer and has a plurality of flow paths for refrigerant. The flow paths are arranged in a substantially circumferential shape with the central axis of the main coil layer set to the center thereof, and a plurality of shim tray holding sections which hold a shim tray for a magnetic body.

16 Claims, 9 Drawing Sheets

GRADIENT MAGNETIC FIELD COIL UNIT, GANTRY FOR MRI APPARATUS, AND MRI APPARATUS

CROSS-REFERENCE TO RELATED APPLICATIONS

This application is based upon and claims the benefit of priority from prior Japanese Patent Applications No. 2007-008123, filed Jan. 17, 2007; and No. 2007-296967, filed Nov. 15, 2007, the entire contents of both of which are incorporated herein by reference.

BACKGROUND OF THE INVENTION

1. Field of the Invention

The present invention relates to a gradient magnetic field coil unit, which has a passive shimming mechanism for correcting the homogeneity of a magnetic field, a gantry for MRI (Magnetic Resonance Imaging) apparatus, and an MRI apparatus.

2. Description of the Related Art

MRI apparatuses have a static magnetic field magnet which generates an extremely strong static magnetic field and is formed in a substantially cylindrical shape. In the static magnetic field generated by the static magnetic field magnet, the strength of several kilo gauss to 10 kilo gauss (1 telsa) is typically required. In addition to the strength, a spatial homogeneity is required in the static magnetic field. As for the spatial homogeneity, the homogeneity of less than several dozen ppm is needed. A spatial region in which a homogeneous magnetic field is required is a spherical region with a diameter of about 50 cm.

The magnetic field is distorted by the effect of a magnetic body. As for a method for correcting the heterogeneity of the static magnetic field, to which the phenomenon is applied, there is provided a method in which a magnetic body such as an iron piece (iron shim) is disposed in a proper position of a gradient magnetic field coil unit. The method is referred to as passive shim. Further, an operation for increasing the homogeneity of a magnetic field like a passive shim or the like is referred to as shimming.

Inside the static magnetic field magnet, a gradient magnetic field coil unit for generating a gradient magnetic field is attached. The gradient magnetic field coil unit includes a main coil layer having a main coil for generating a gradient magnetic field and a shield coil layer having a shield coil for generating a magnetic field which shields a leakage magnetic field from the main coil. The coupling of the gradient magnetic field from the main coil and the magnetic field from the shield coil reduces the magnetic field strength within an imaging region. Therefore, it is preferable to separate the main coil and the shield coil from each other, if possible. Accordingly, a shimming layer which houses an iron shim for correcting the heterogeneity of a static magnetic field is provided between the main coil layer and the shield coil layer.

Recently, to enhance the image quality of an MR image, a demand for increasing the strength of a gradient magnetic field is growing. To increase the gradient magnetic field strength, a high current needs to be supplied to the gradient magnetic field coil unit. As a high current is supplied, the heating value of the main coil and the shield coil increases. Therefore, the temperature of the iron shim installed in the gradient magnetic field coil unit increases. As the temperature of the iron shim increases, the homogeneity of the static magnetic field is varied. Accordingly, a main coil cooling layer having a cooling tube for cooling the main coil is provided between the main coil layer and the shimming layer, and a shield coil cooling layer having a cooling tube for cooling the shield coil is provided between the shield coil layer and the shimming layer. These cooling tubes are attached in a spiral shape along the substantially cylindrical shape of the gradient magnetic field coil unit (for example, refer to Japanese Unexamined Patent Application Publication No. 2006-311957).

Meanwhile, a demand for widening a bore diameter is growing, in order to improve the interior comfort of a patient. To widen a bore diameter without changing the inner diameter of the static magnetic field magnet, the inner diameter of the gradient magnetic field coil unit needs to be widened. Therefore, it is difficult to secure a sufficient space in the main coil cooling layer, the shimming layer, and the shield coil cooling layer, which are present between the main coil layer and the shield coil layer.

BRIEF SUMMARY OF THE INVENTION

Accordingly, it is an object of the present invention to provide a gradient magnetic field coil unit which achieves a reduction in radial thickness, a gantry for MRI apparatus, and an MRI apparatus.

According to a first aspect of the invention, a gradient magnetic field coil unit includes a main coil layer that has a main coil for generating a gradient magnetic field and is formed in a substantially cylindrical shape; a shield coil layer that is attached to the outside of the main coil layer and has a shield coil for generating a magnetic field which shields a leakage magnetic field from the main coil; and a cooling layer that is attached between the main coil layer and the shield coil layer and has a plurality of flow paths for refrigerant, which are arranged in a substantially circumferential shape with the central axis of the main coil layer set to the center thereof, and a plurality of shim tray holding sections which hold a shim tray for a magnetic body.

According to a second aspect of the invention, a gradient magnetic coil unit includes a main coil that generates a gradient magnetic field and is disposed in a substantially cylindrical shape; a shield coil that is attached to the outside of the main coil and generates a correcting magnetic field for homogenizing a static magnetic field generated from a static magnetic field magnet; a plurality of shim trays for a magnetic body that are arranged in a region, having a substantially circumferential shape with the central axis of the main coil set to the center thereof, between the main coil and the shield coil; and a plurality of flow paths for refrigerant that are discretely arranged in the region.

According to a third aspect of the invention, a gradient magnetic field coil unit includes a main coil layer that has a main coil for generating a gradient magnetic field and is formed in a substantially cylindrical shape; a first cooling layer that is attached to the outside of the main coil layer and has a flow path for refrigerant, the flow path being buried in a spiral shape along the central axis of the main coil; a second cooling layer that is attached to the outside of the first cooling layer and has a plurality of flow paths for refrigerant, which are arranged in a substantially circumferential shape with the central axis set to the center thereof, and a plurality of shim tray holding sections which hold a shim tray for a magnetic body; and a shield coil layer that is attached to the outside of the second cooling layer and has a shield coil for generating a magnetic field which shields a leakage magnetic field from the main coil.

According to a fourth aspect of the invention, a gantry for MRI apparatus includes a static magnetic field magnet that generates a static magnetic field and is formed in a substantially cylindrical shape; a main coil layer that has a main coil for generating a gradient magnetic field and is formed in a substantially cylindrical shape; a shield coil layer that is attached to the outside of the main coil layer and has a shield coil for generating a magnetic field which shields a leakage magnetic field from the main coil; and a cooling layer that is attached between the main coil layer and the shield coil layer and has a plurality of flow paths for refrigerant, which are arranged in a substantially circumferential shape with the central axis of the main coil layer set to the center thereof, and a plurality of shim tray holding sections which hold a shim tray for a magnetic body.

According to a fifth aspect of the invention, there is provided an MRI apparatus which obtains a magnetic resonance image related to a subject loaded in a gantry. The gantry includes: a static magnetic field magnet that generates a static magnetic field and is formed in a substantially cylindrical shape; a main coil layer that has a main coil for generating a gradient magnetic field and is formed in a substantially cylindrical shape; a shield coil layer that is attached to the outside of the main coil layer and has a shield coil for generating a magnetic field which shields a leakage magnetic field from the main coil; and a cooling layer that is attached between the main coil layer and the shield coil layer and has a plurality of flow paths for refrigerant, which are arranged in a substantially cylindrical shape with the central axis of the main coil layer set to the center thereof, and a plurality of shim tray holding sections which hold a shim tray for a magnetic body.

Additional objects and advantages of the invention will be set forth in the description which follows, in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principle of the invention.

DETAILED DESCRIPTION OF THE INVENTION

Hereinafter, embodiments of the present invention will be described with reference to the accompanying drawings.

Figure 1:
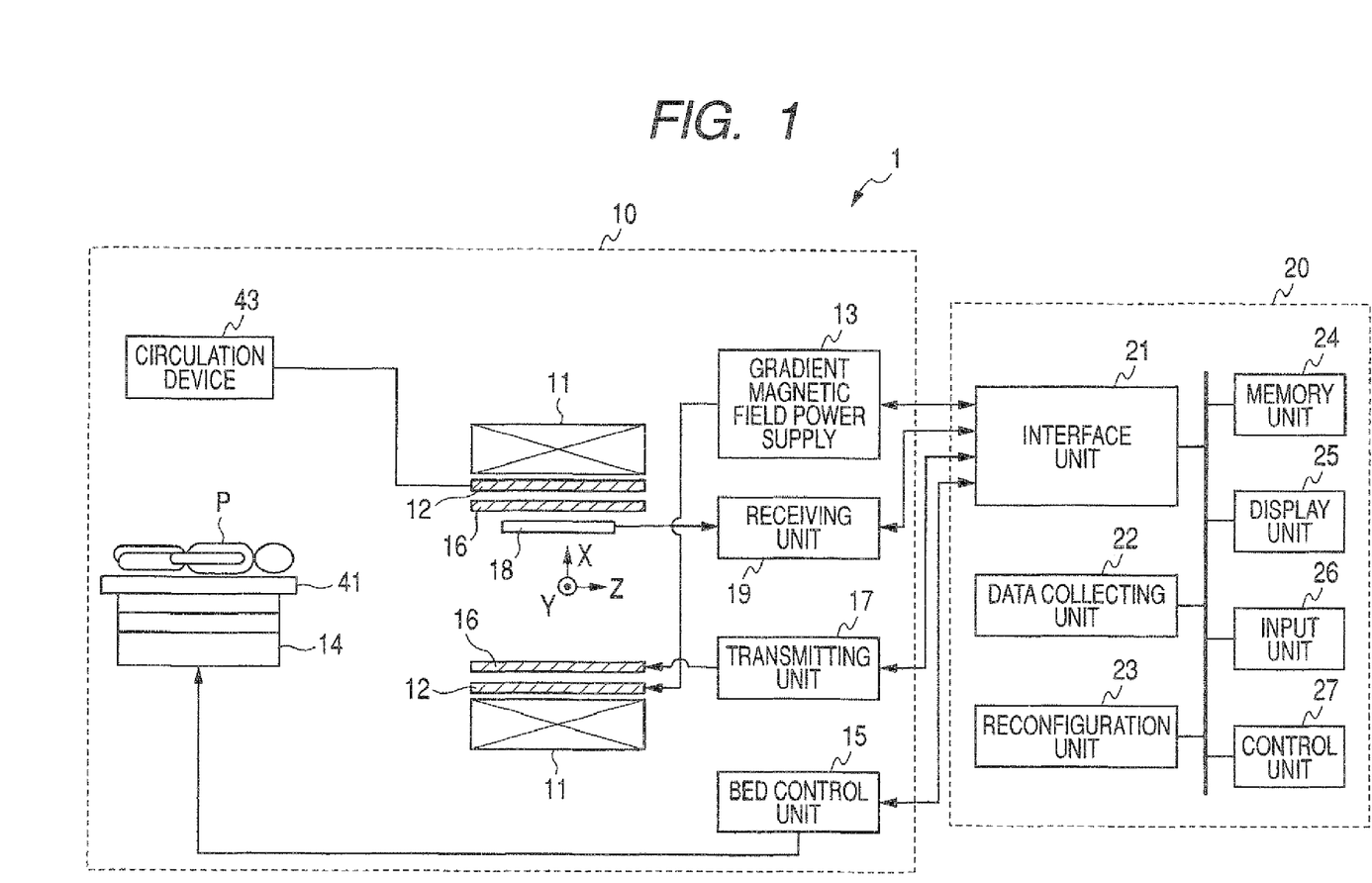
FIG. 1 is a view showing the construction of an MRI apparatus according to an embodiment of the invention.

FIG. 1 is a view showing the construction of an MRI apparatus 1 according to an embodiment of the invention. As shown in FIG. 1, the MRI system 1 has a gantry 10 and a computer system 20. The gantry 10 has a static magnetic field magnet 11, an ASGC (Actively Shielded Gradient Coil) type gradient magnetic field magnet 12, a gradient magnetic field power supply 13, a bed 14, a bed control unit 15, a transmission RP coil 16, a transmitting unit 17, a reception RF coil 18, and a receiving unit 19. Hereinafter, the respective constituent elements will be described.

The static magnetic field magnet 11 is formed in a substantially cylindrical shape with a hollow portion, and generates a static magnetic field in a substantially cylindrical inner portion thereof. The substantially cylindrical shape also includes an elliptical shape. A space region of the generated magnetic field, of which the homogeneity is excellent, is an imaging region. The magnetic field in the image region has a homogeneity of less than several dozen ppm. As for the static magnetic field magnet 11, a permanent magnet or superconducting magnet is used. The central axis of the cylindrical shape of the static magnetic field magnet 11 is defined as a Z-axis, a vertical direction thereto is defined as an X-axis, and a horizontal direction thereto is defined as a Y-axis.

The gradient magnetic coil unit 12 is attached to the inside of the static magnetic field magnet 11. The gradient magnetic coil unit 12 receives a current from the gradient magnetic filed power supply 13 so as to generate a gradient magnetic field. As for the gradient magnetic field, there are provided a gradient magnetic field for slice selection, a gradient magnetic field for phase encoding, and a gradient magnetic field for leading-out. The gradient magnetic field for slice selection is used for arbitrarily determining an imaging cross-section. The gradient magnetic field for phase encoding is used for encoding the phase of a magnetic resonance signal (hereinafter, referred to as an MR signal) depending on a spatial position. The gradient magnetic field for leading-out is used for encoding the frequency of an MR signal depending on a spatial position.

The gradient magnetic field coil unit 12 is provided with a flow path through which a refrigerant for cooling the gradient magnetic field coil unit 12 passes. Hereinafter, the refrigerant is set to cooling water. However, another material may be used as the refrigerant, in addition to the cooling water. The flow path is connected to a resin hose on the body surface of the gradient magnetic field coil unit 12.

A circulation device 43 is connected to the resin hose and is provided with a heat exchanger and a circulation pump. The circulation pump circulates cooling water between the gradient magnetic field coil unit 12 and the heat exchanger. The heat exchanger cools the gradient magnetic field coil unit 12, thereby cooling down warmed cooling water.

On a top board 41 of the bed 14, a subject P is loaded. Typically, the bed 14 is installed such a manner that the longitudinal direction of the top board 41 of the bed 14 is parallel to the central axis of the static magnetic field magnet 11. The top board 41 of the bed 14 is inserted into a cavity (bore) of the gradient magnetic field coil unit 12. The top board 41 of the bed 14 is driven by the bed control unit 15 so as to move in the longitudinal direction (Z-axis) and the vertical direction (X-axis).

The transmission RF coil 16 is installed inside the gradient magnetic field coil unit 12. The transmission RF coil 16 receives an RF pulse from the receiving unit 17 so as to generate an RF magnetic field.

The receiving unit 17 has an oscillating section, a phase selecting section, a frequency converting section, an amplitude modulating section, an RF power amplifying section and so on, which are built therein. To excite a target atomic nucleus existing in the subject P, the oscillating section generates an RF signal, which oscillates at a unique resonance frequency in the target atomic nucleus. The phase selecting section selects the phase of the RF signal. The frequency converting section converts the frequency of the RF signal output from the phase selecting section. The amplitude modulating section modulates the amplitude of the RF signal output from the frequency converting section, in accordance with a sine function, for example. The RF power amplifying section amplifies the RF signal output from the amplitude modulating section. Then, as a result of the operations of the respective sections, the transmitting unit 17 transmits an RE pulse corresponding to a Larmor frequency to the transmission RF coil 16.

The reception RF coil 18 is disposed inside the gradient magnetic field coil unit 12. The reception RF coil 18 receives an RM signal which is radiated from the subject P by an effect of the RF magnetic field generated from the transmission RF coil 17. Typically, the reception RF coil 18 is used together with the transmission RF coil RF.

The receiving unit 19 receives the output signal from the reception RE coil 18. The receiving unit 19 performs amplification, detection, and A/D conversion on the received MR signal so as to generate magnetic resonance signal data (MR signal data) which is a digital signal.

The computer system 20 has an interface unit 21, a data collecting unit 22, a reconfiguration unit 23, a memory unit 24, a display unit 25, an input unit 26, and a control unit 27. Hereinafter, the respective constituent elements will be described.

The interface unit 21 is connected to the gradient magnetic field power supply 13, the bed control unit 15, the transmitting unit 17, the reception REF coil 18, the receiving unit 19 and so on. The interface unit 21 inputs and outputs signals which are transmitted and received between the computer system 20 and the respective units connected to the interface unit 21.

The data collecting unit 22 collects digital signals, output from the receiving unit 19, through the interface unit 21.

The reconfiguration unit 23 reconfigures MR image data, based on the MR signal data stored in the memory unit 24.

The memory unit 24 stores the MR signal data and the MR image data.

The display unit 25 displays MR images and various kinds of information under the control of the control unit 27. As for the display unit 25, a display device such as a liquid crystal display or the like can be used.

The input unit 26 receives various instructions or information from an operator. As for the input unit 26, a pointing device such as a mouse or a track ball, a selection device such as a mode switch, or an input device such as a keyboard can be properly used.

The control unit 27 controls the respective constituent elements such that the operation as the MRI apparatus 1 can be implemented, thereby obtaining an RM image related to a subject.

Figure 2:
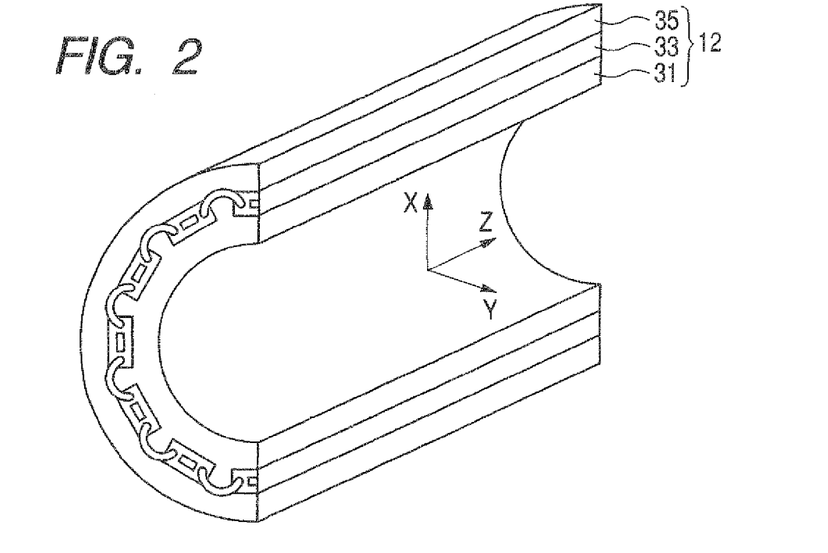
FIG. 2 is a partial perspective view of a gradient magnetic field coil unit of FIG. 1.
Figure 3A:
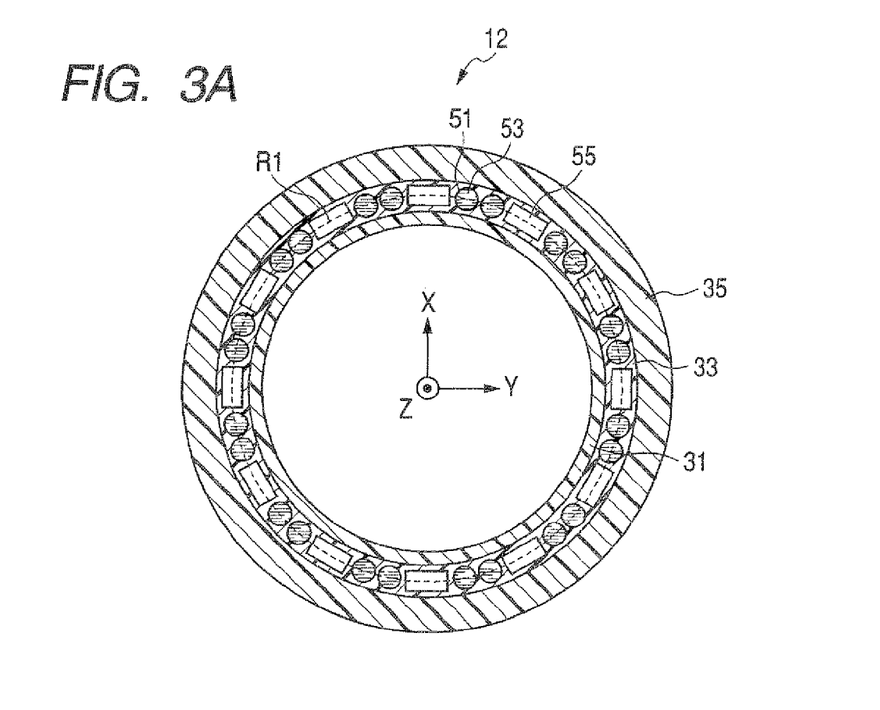
FIG. 3A is a cross-sectional view of the gradient magnetic field coil unit of FIG. 2 on a XY plane.

FIG. 2 is a partial perspective view of the gradient magnetic field coil unit 12 of FIG. 1. FIG. 3A is a cross-sectional view of the gradient magnetic field coil unit 12 on the XY plane. As shown in FIGS. 2 and 3A, the gantry 10 has the gradient magnetic field coil unit 12 formed in a substantially cylindrical shape. The gradient magnetic field coil unit 12 has a three-layer structure that a main coil layer 31, a cooling layer 33, and a shield coil layer 35 are sequentially formed from the inside.

The main coil layer 31 is formed by molding three main coils (an X main coil, a Y main coil, and a Z main coil) in a substantially cylindrical shape using resin. The respective main coils receive currents from the gradient magnetic field power supply 13 so as to generate gradient magnetic fields of which the magnetic field intensity changes along the X-, Y-, and Z-axes, respectively.

The shield coil layer 35 is formed by molding three shield coils (an X shield coil, a Y shield coil, and a Z shield coil) in a substantially cylindrical shape using resin. The respective shield coils receive a current from the gradient magnetic field power supply 13 so as to generate a magnetic field for shielding a leakage magnetic field from the main coil layer 31.

The cooling layer 33 is attached between the main coil layer 31 and the shield coil layer 35. The cooling layer 33 is a cingulated region having a substantially circumferential shape, with the central axis of the main coil layer 31 being set to the center thereof. In the cooling layer 33, for example, a plurality of cooling tubes 51 as straight tubes, which compose flow paths 53, are discretely disposed in a substantially circumferential shape with the Z-axis set to the center thereof. The respective cooling tubes 51 are arranged parallel to the Z-axis. Each of the cooling tubes 51 has a substantially square cylindrical shape or a substantially cylindrical shape. The inside of the cooling tube 51 serves as the flow path 53 through which cooling water flows. The cooling tube 51 is formed of a material having high heat conductivity, for example, copper or the like. The cooling tube 51 cooled by the cooling water cools down the main coil serving as a heat source disposed inside the cooling layer 33 and the shield coil serving as a heat source attached outside the cooling layer 33.

In a plurality of spaces defined between the plurality of cooling tubes 51 arranged in a substantially circumferential shape, a plurality of shim tray holding sections 55 are arranged. The plurality of shim tray holding sections 55 and the plurality of cooling tubes 51 are disposed along a circumference R1 with an identical diameter, as shown in FIG. 3A. Typically, the plurality of shim tray holding sections 55 are arranged parallel to the Z-axis and composed of transverse holes which pass through the cooling layer 33 in the Z-axis direction. The shim tray holding sections 55 hold a shim tray on which an iron piece (hereinafter, referred to as an iron shim) is mounted. The shim tray has a structure which is capable of holding a proper number of iron shims in proper positions. The proper number of iron shims are disposed in proper positions so as to correct the heterogeneity of a magnetic field, which is referred to as passive shimming.

Figure 3B:
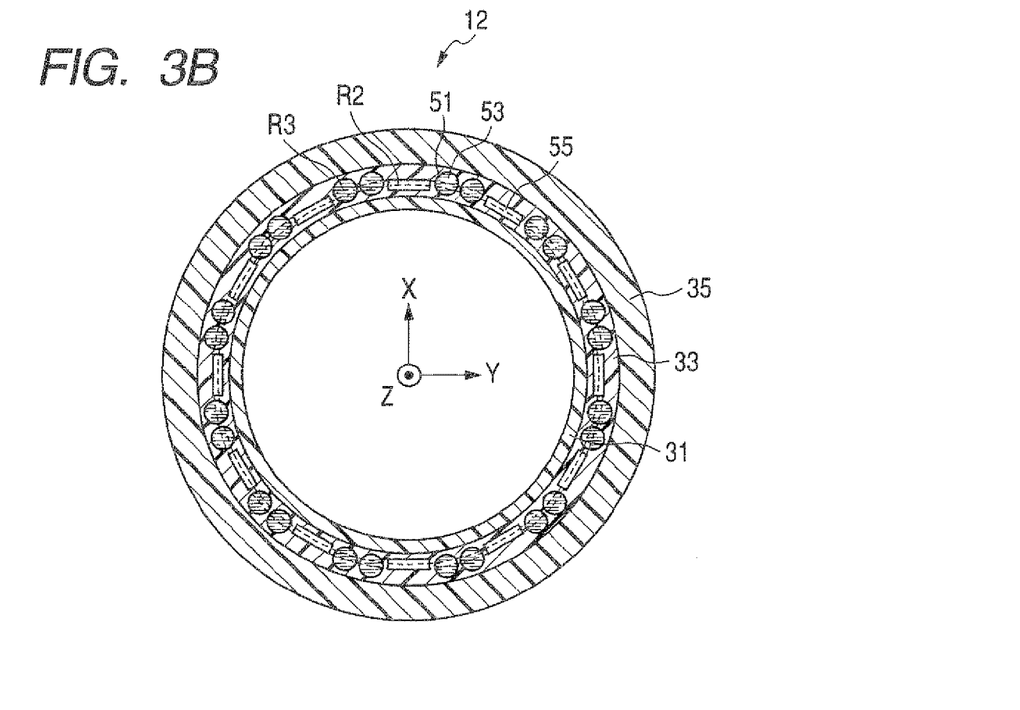
FIG. 3B is a cross-sectional view of the gradient magnetic field coil unit of FIG. 2 different from that of FIG. 3A, on the XY plane.
Figure 3C:
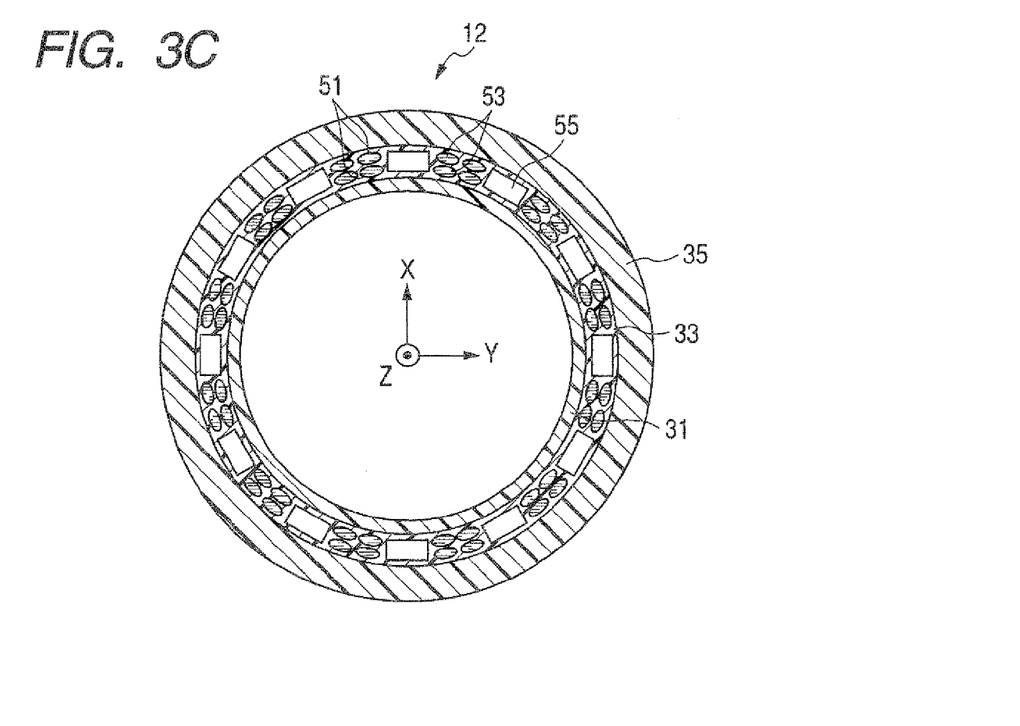
FIG. 3C is a cross-sectional view of the gradient magnetic-field coil unit of FIG. 2 different from those of FIGS. 3A and 3B, on the XY plane.

As shown in FIG. 3A, the respective flow paths 53 and the shim tray 59 are disposed in a cylindrical shape with an identical diameter. Without being limited thereto, however, as shown in FIG. 3B, a circumference R2 along which the shim tray holding section 55 are arranged and a circumference R3 along which the cooling tubes 51 are arranged may not be identical to each other. Further, inside the cooling layer 33, plural lines (for example, two lines) of the flow paths 53 may be arranged in a substantially cylindrical shape, as shown in FIG. 3C.

Hereinafter, specific means for mounting the cooling tubes 51 and the shim tray holding sections 55 into the cooling layer 33 will be described.

The cooling layer 33 has a plurality of through-holes formed therein. In each of the through-holes, a tube module 57 is fitted, which has two cooling tubes 51 and one shim tray holding section 55. The cooling layer 33 is formed by molding the plurality of tube modules 57 in a substantially cylindrical shape using resin, the plurality of tube modules 57 being arranged in a substantially circumferential shape with the Z-axis set to the center thereof.

Figure 4:
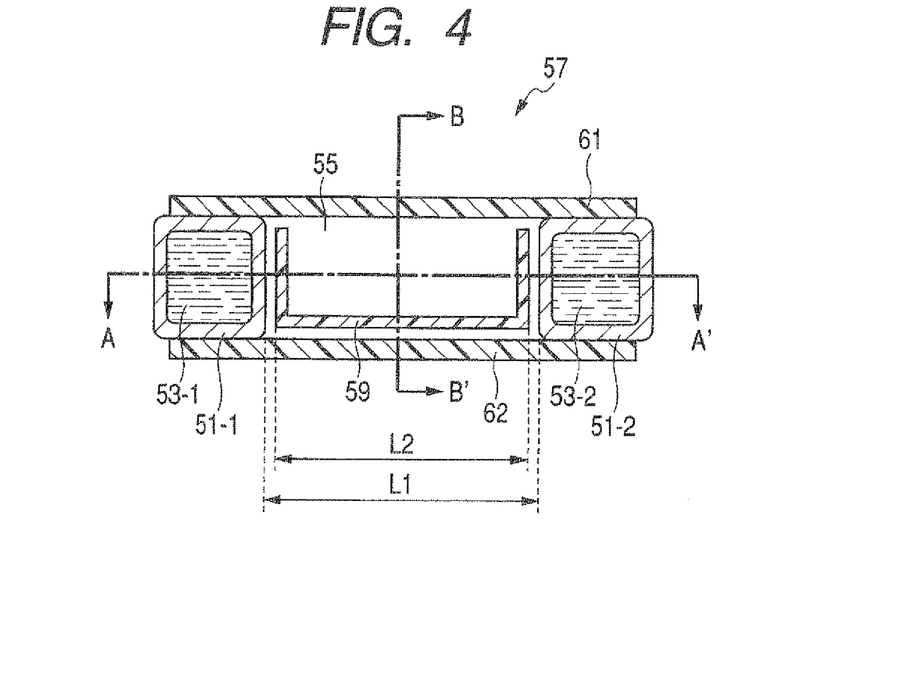
FIG. 4 is a transverse cross-sectional view of a tube module according to the invention.

FIG. 4 is a transverse cross-sectional view of the tube module 57, in which a direction perpendicular to the paper surface is the Z-axis direction. As shown in FIG. 4, the tube module 57 is composed of two cooling tubes 51-1 and 51-2 and two fixing plates 61 and 62. The cooling tubes 51-1 and 51-2 are arranged parallel to the Z-axis, with a distance L1 set therebetween. The upper and lower portions of the cooling tube 51-1 and 51-2 are fixed by the reed-shaped fixing plates 61 and 62, respectively. The tube module 57 has a hollow structure formed in a square pole shape, for example. The hollow portion of the tube module 57 functions as the shim tray holding section 55, and the shim tray 59 is inserted into the shim tray holding section 55. The fixing plates 61 and 62 are formed of a material with excellent heat conductivity, for example, a composite material in which a thermally-conductive filler is mixed with resin or a resin material. The shim tray holding section 55 holds the shin tray 59 so as to slide in the Z-axis direction. The length L1 of the shim tray holding section 55 in the Y-axis direction is slightly larger than the width L2 of the shim tray 59 in the Y-axis direction. Therefore, two of the cooling tubes 51 also serve as guide rails which guide the shim tray 59 so as to slide in the Z-axis direction.

Figure 5:
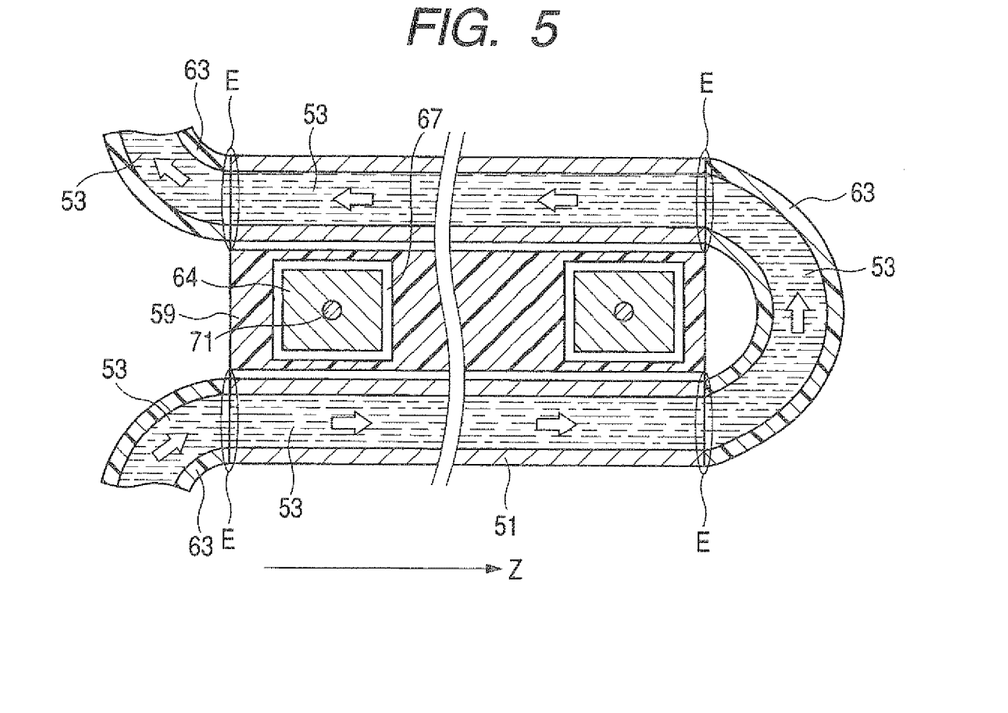
FIG. 5 is a cross-sectional view taken along line A-A' of FIG. 4 or 12.

Hereinafter, a cooling function of the tube module 57 will be described with reference to FIG. 5. FIG. 5 is a cross-sectional view taken along line A-A' of FIG. 4. As shown in FIG. 5, both end portions E of the cooling tubes 51 (shaded portions of FIG. 5) in the Z-axis direction are coupled to a plurality of connection tubes 63 having a substantially cylindrical shape. The connection tubes 63 are coupled to the end portions E of the cooling tubes 51 through brazing or the like. The plurality of cooling tubes 51, which are arranged in a substantially circumferential shape with the Z-axis set to the center, are integrally connected through the plurality of connection tubes 63. Although not shown in FIG. 5, both end portions of the integrally-connected cooling tubes 51 are connected to the circulation device 43 through a hose formed of resin or the like. A circulation system for cooling water is completed by the cooling tubes 51, the connection tubes 63, and the circulation device 43. As indicated by a heavy-line arrow of FIG. 5, cooling water is circulated through the flow path 53 by the circulation device 43. As the cooling water is circulated through the flow path 53, the cooling tube 51 is cooled. The cooled cooling tube 51 cools the main coils and the shield coils heated by the supply of current. Further, the cooled cooling tube 51 cools the iron piece 64 housed in the shim tray 59.

Figure 6:
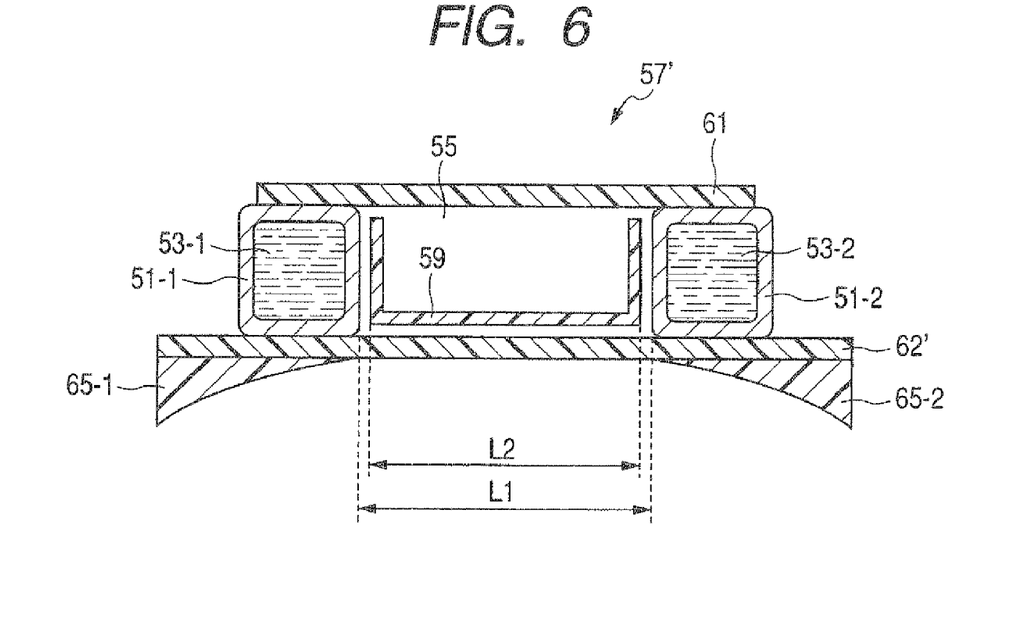
FIG. 6 is a transverse cross-sectional view of a tube module different from that of FIG. 4.

FIG. 6 is a transverse cross-sectional view of a tube module 57' having a structure for increasing a cooling effect. As shown in FIG. 6, the tube module 57' has two cooling fins 65-1 and 65-2 (hereinafter, abbreviated to fins) for increasing a cooling effect of the cooling tube 51 with respect to the main coils and so on. The two fins 65-1 and 65-2 are formed in a substantially circular arc shape so as to be adjacent to the main coils. The fins 65-1 and 65-2 are formed of a material with excellent heat conductivity, for example, a composite material in which a thermally-conductive filler is mixed with resin or a resin material. That is, a contact area between the main coil layer and the cooling source is increased by the fins. The fins 65-1 and 65-2 are attached to the lower end portion of the fixing plate 62' connected to the cooling tubes 51-1 and 51-2. The heat exchange between the main and shield coils and the cooling water is carried out through the cooling tubes 51-1 and 51-2, the fixing plate 62', and the fins 65-1 and 65-2. That is, the tube module 57' of FIG. 6 has a higher cooling effect than the tube module 57 of FIG. 5.

Hereinafter, a passive shimming function of the tube module 57 will be described.

Figure 7:
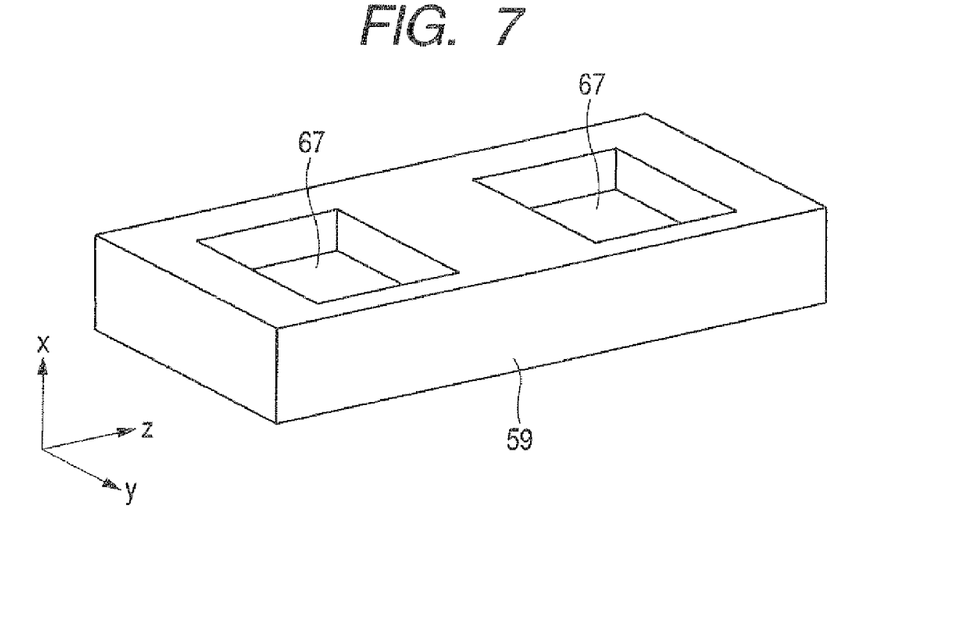
FIG. 7 is a perspective view of a shim tray of FIGS. 4 and 6.

FIG. 7 is a perspective view of the shim tray 59. As shown in FIG. 7, the shim tray 59 has a plurality of recesses 67 for housing the iron shim 64, the recesses 67 being formed along the Z-axis direction.

Figure 8:
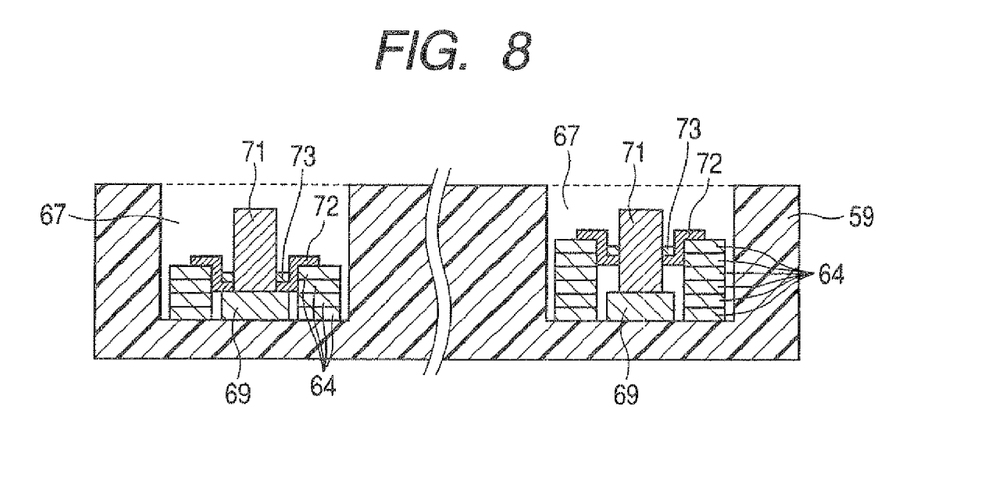
FIG. 8 is a cross-sectional view taken along line B-B' of FIG. 4 or 12.
Figure 9:
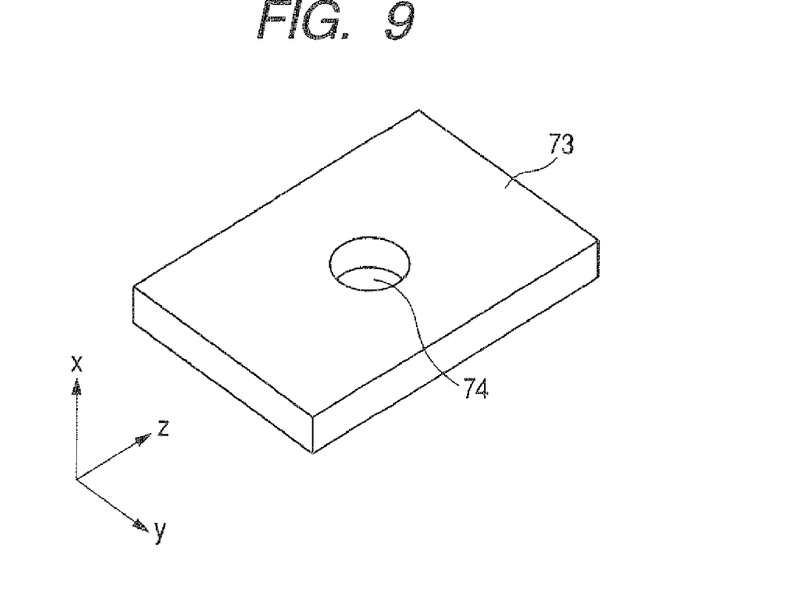
FIG. 9 is a perspective view of an iron shim of FIGS. 4 and 8.

FIG. 8 is a cross-sectional view of line B-B' of FIG. 4. As shown in FIG. 8, a stepped spacer 69 is attached into each of the recesses 67 of the shim tray 55. The spacer 69 has a bolt 71 fixed thereto. FIG. 9 is a perspective view of the iron shim 64. As shown in FIG. 9, a hole 74 is formed in the central portion of the iron shim 64, the hole 74 having such a diameter that the spacer 69 can passes through the hole 74. For the passive shimming, a proper number of iron shims 64 are stacked in a proper position of the recess 67, by passing the bolt 71 and the spacer 69 through the hole 74. The stacked iron shims 64 are pressed from the upper side by a plate 72. The stacked iron shims 64 are fixed by a nut 73 screwed to the bolt 71 through the plate 72. In such a structure, the nut 73 is prevented from being located in a higher position than the iron shims 64. That is, a space required for housing the iron shims 64 depends on the depth of the recess 67 and the height of the bolt 71. Accordingly, as the depth of the recess 67 and the height of the bolt 71 are adjusted, the radial thickness of the cooling layer 33 is reduced, so that the iron shims 64 can be housed. Moreover, in the recess 67 of the shim tray 59, the spacer 69 may not be attached, but a direct bolt 71 may be attached.

Figure 10:
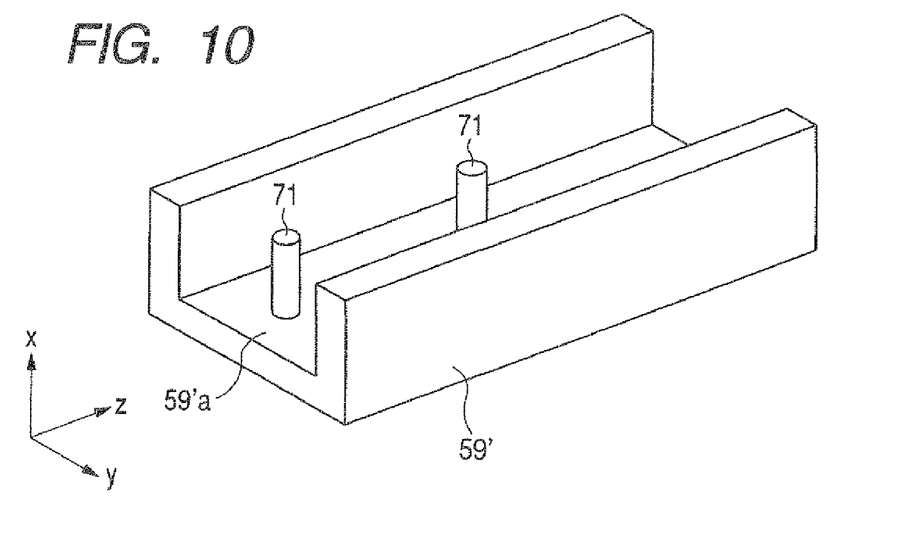
FIG. 10 is a perspective view of a shim tray having a different structure from the shim tray of FIG. 7.

FIG. 10 is a perspective view of a shim tray 59' having a different structure from the shim tray 59 of FIG. 7. As shown in FIG. 10, the shim tray 59' has no recess. In this case, the iron shim 64 is fixed by the bolt 71 and the nut 73 which are attached to a proper position of a tray surface 59'a of the shim tray 59'.

Figure 11:
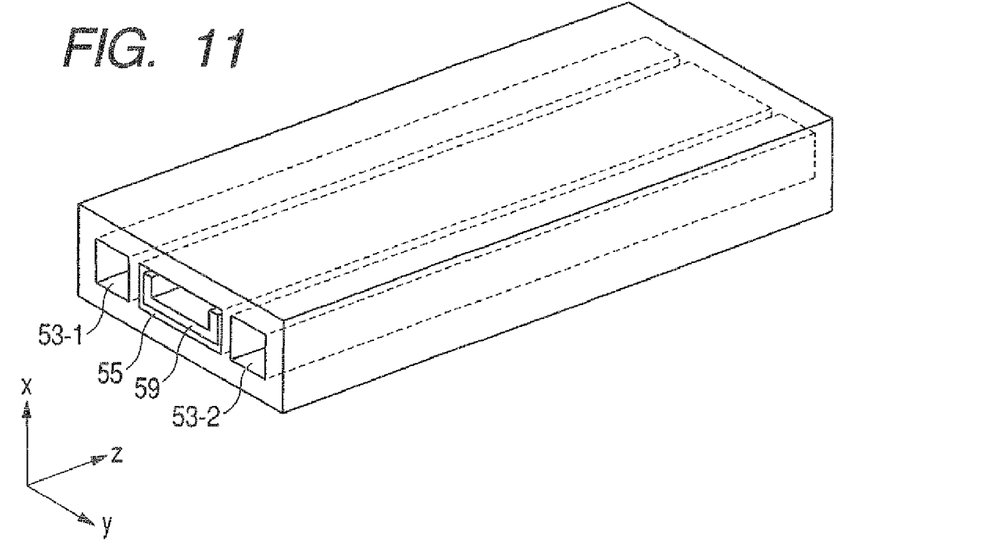
FIG. 11 is a perspective view of a tube module different from that of FIGS. 4 and 6.
Figure 12:
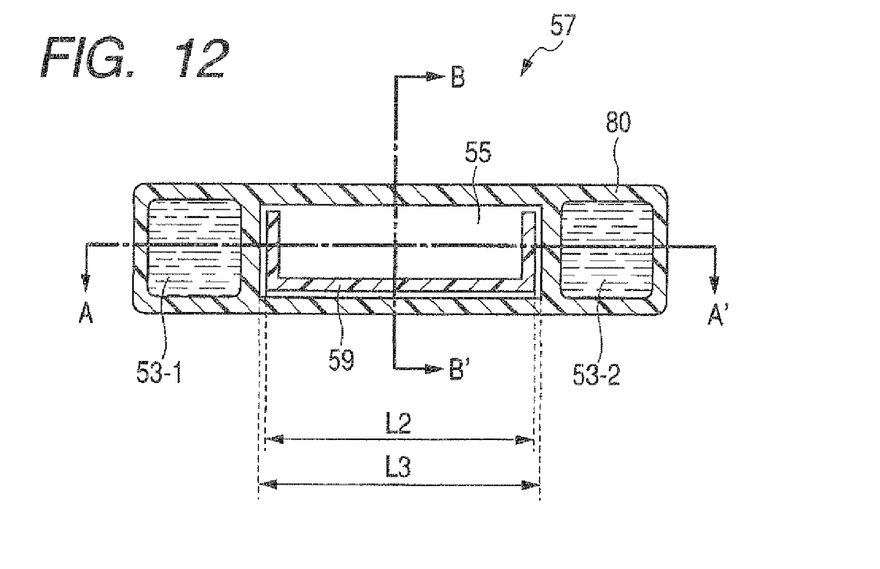
FIG. 12 is a transverse cross-sectional view of the tube module of FIG. 11.

Hereinafter, the structure of a tube module 80 different from those of FIGS. 4 and 6 will be described. FIG. 11 is a perspective view of the tube module 80, and FIG. 12 is a transverse cross-sectional view of the tube module 80. The tube module 80 is formed of a material with excellent heat conductivity, for example, a composite material in which a thermally-conductive filler is mixed with resin or a resin material. As shown in FIGS. 11 and 12, the tube module 80 has three through-holes which are formed to pass through the tube module 80 along the Z-axis direction. Three of the through-holes are formed parallel to the Z-axis direction. Among three through-holes, the through-holes positioned in both ends serve as flow paths 53-1 and 53-2 through which cooling water passes. The through-hole positioned in the middle of three through-holes serves as a shim tray holding section 55. The length L3 of the shim tray holding section 55 in the Y-axis direction is slightly larger than the length L2 of the shim tray 53 in the Y-axis direction. Therefore, the shim tray holding section 55 plays a roll as a guide rail which guides the shim tray 59 so as to slide in the Z-axis direction.

A cross-sectional view taken along line A-A' of FIG. 12 corresponds to FIG. 5. In this case, the shaded portion of FIG. 5 is a portion of the tube module 80. Accordingly, the connection tube 63 is connected to the end portion E of a portion of the tube module 80 in the Y-axis direction such that the flow path 53, the connection tube 63, and the circulation device 43 compose the circulation system for cooling water.

A cross-sectional view taken along line B-B' of FIG. 12 corresponds to FIG. 8, as it is.

According to this embodiment, a reduction in radial thickness can be achieved.

[Modification]

Figure 13:
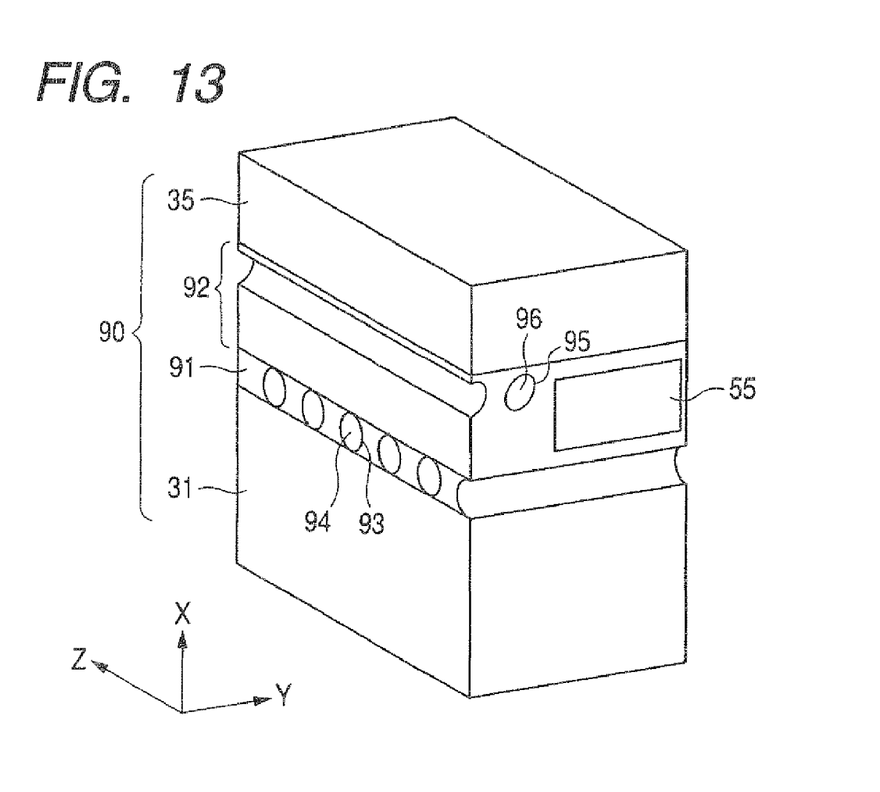
FIG. 13 is a partial perspective view of a gradient magnetic field coil unit according to a modification of the invention.

FIG. 13 is a partial perspective view of a gradient magnetic field coil unit 90 according to a modification of the invention. As shown in FIG. 13, the gradient magnetic field coil unit 90 has a four-layer structure that a main coil layer 31, a first cooling layer 91, a second cooling layer 92, and a shield coil layer 35 are sequentially formed.

The first cooling layer 91 is attached to the outside of the main coil layer 31. The first cooling layer 91 has a first cooling tube 93 buried in a spiral shape along the Z-axis. The inside of the first cooling tube 93 serves as a flow path 94 through which cooling water as refrigerant flows. The first cooling tube 93 cooled by the cooling water cools down the main coils of the main coil layer 31 which is a main heat source of the gradient magnetic field coil unit 90. The first cooling tube 93 having a spiral shape has a larger contact area with the main coil layer 31 than the cooling tube which is shown in FIG. 2 and has a straight-tube structure parallel to the Z-axis. Therefore, it is possible to effectively cool the main coils.

The second cooling layer 92 is attached to the outside of the first cooling layer 91. In the second cooling layer 92, a plurality of second cooling tubes 95 as straight tubes are disposed in a substantially circumferential shape with the Z-axis set to the center thereof. The respective second cooling tubes 95 are arranged parallel to the Z-axis. In a plurality of spaces between the plurality of second cooling tubes 96, the plurality of shim tray holding sections 55 are installed.

The inside of the second cooling tube 95 serves as a flow path 96 through which cooling water as refrigerant flows. The second cooling tube 95 cooled by the cooling water cools down the shield coils of the shield coil layer 35 as a heat source. Since the shield coils generate a smaller amount of heat than the main coils, the cooling tube 95 having a straight-tube structure can sufficiently cool the shield coils.

Specifically, the tube module 57 or 80 is fitted into the second cooling layer 92 so as to mount the second cooling tube 95 and the shim tray holding section 55.

Figure 14:
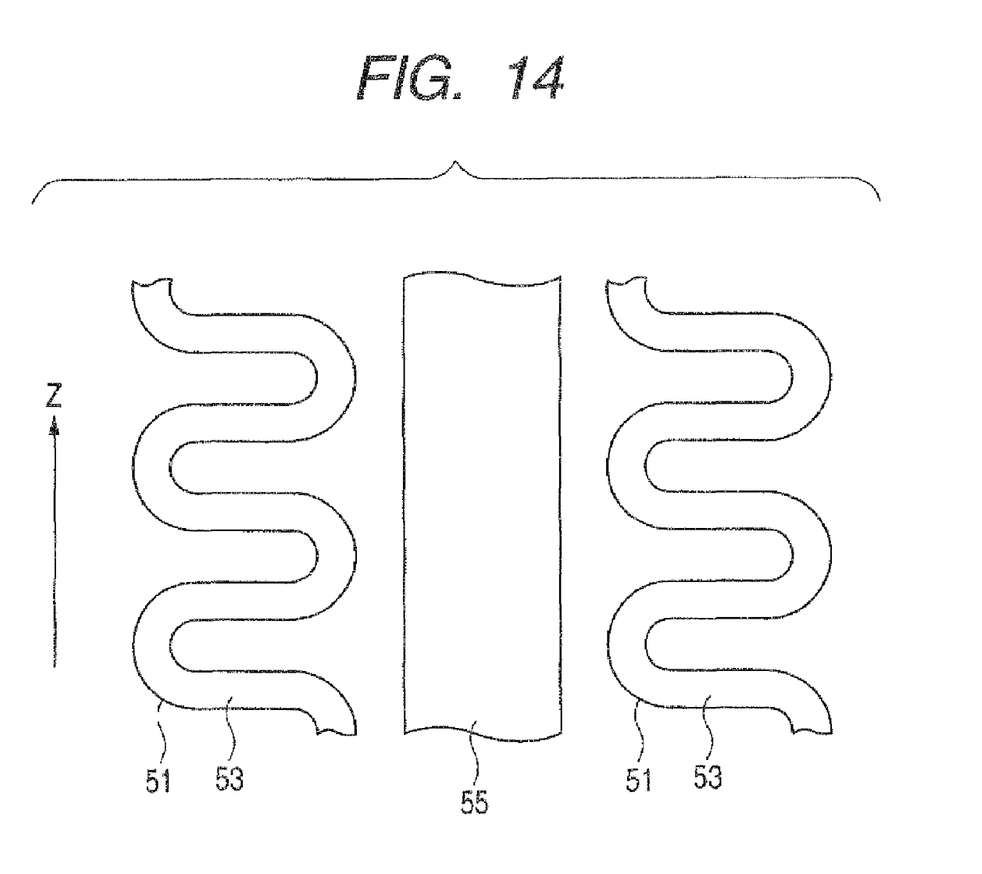
FIG. 14 is a view showing a flow path having a corrugated shape along a Z-axis according to the modification of the invention.

In the above-described embodiment, the respective flow paths 53 and 96 (the cooling tubes 51 and 95) are set parallel to the Z-axis. Without being limited thereto, however, as shown in FIG. 14, the respective flow paths 53 may be formed in a corrugated shape along the Z-axis so as to increase a cooling function with respect to the main coils and the shield coils, compared with the above-described embodiment. Further, the respective flow paths 53 may be formed in a zigzag or spiral shape along the Z-axis.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A gradient magnetic field coil unit comprising:
   a main coil layer that has a main coil for generating a gradient magnetic field and is formed in a substantially cylindrical shape;
   a shield coil layer that is attached to the outside of the main coil layer and has a shield coil for generating a magnetic field which shields a leakage magnetic field from the main coil; and
   a cooling layer arranged between the main coil layer and the shield coil layer and including a plurality of refrigerant flow paths extending parallel to an axis of the main coil layer; and
   a plurality of shim trays for receiving passive shims, the shim trays being included in the cooling layer, extended parallel to the axis of the main coil layer, and interposed between a corresponding pair of adjacent ones of the refrigerant flow paths.

2. The gradient magnetic field coil unit according to claim 1,
   wherein the refrigerant flow paths and the shim trays are both arranged substantially circumferentially about said axis at a substantially identical diameter.

3. The gradient magnetic field coil unit according to claim 1,
   wherein the cooling layer has a plurality of modules fitted substantially circumferentially about said axis and each of the modules includes at least one shim tray and at least two flow paths.

4. The gradient magnetic field coil unit according to claim 3,
   wherein the cooling layer includes a plurality of modules fitted substantially circumferentially about said main coil layer axis, each module including at least one shim tray and at least two refrigerant flow paths.

5. The gradient magnetic field coil unit according to claim 4,
   wherein the module is formed of a resin material.

6. The gradient magnetic field coil unit according to claim 4,
   wherein the module is formed of a composite material in which a thermally-conductive filler is mixed with a resin material.

7. The gradient magnetic field coil unit according to claim 3,
   wherein adjacent end portions of the flow paths are connected through a connection section having a hollow portion, through which the refrigerant flows, such that the refrigerant circulates through all the flow paths included in the cooling layer.

8. The gradient magnetic field coil unit according to claim 3,
   wherein each of the modules has two cooling tubes of which the hollow portion is the refrigerant flow path; a first fixing plate which fixes the upper end portions of the two cooling tubes; and a second fixing plate which fixes the lower end portions of the two cooling tubes; and
   the shim tray is held in a space defined by the two cooling tubes and the first and second fixing plates.

9. The gradient magnetic field coil unit according to claim 1,
   wherein the shim tray has a bolt and a nut screwed to the bolt, and the passive shim is fixed by the bolt and the nut.

10. A gradient magnetic field coil unit, comprising:

a main coil layer that has a main coil for generating a gradient magnetic field and is formed in a substantially cylindrical shape;

a shield coil layer that is attached to the outside of the main coil layer and has a shield coil for generating a magnetic field which shields a leakage magnetic field from the main coil; and a cooling layer that is attached between the main coil layer and the shield coil layer and has a plurality of flow paths for refrigerant arranged in a substantially circumferential shape with the central axis of the main coil layer set to the center thereof, and a plurality of shim tray holding sections which hold a shim tray for a magnetic body;

wherein each of the modules has three through-holes formed in a line, the flow paths are the through-holes formed at both ends, among the three through-holes, and the shim tray holding section is the central through-hole of the three through-holes.

11. The gradient magnetic field coil unit according to claim 10, wherein the module is formed of a resin material.

12. The gradient magnetic field coil unit according to claim 10, wherein the module is formed of a composite material in which a thermally-conductive filler is mixed with a resin material.

13. A gradient magnetic coil unit comprising:

a main coil that generates a gradient magnetic field and is disposed in a substantially cylindrical shape about an axis;

a shield coil that is attached to the outside of the main coil and generates a correcting magnetic field for homogenizing a static magnetic field generated from a static magnetic field magnet;

a cooling layer arranged between the main coil layer and the shield coil layer, and including a plurality of refrigerant flow paths extended parallel to an axis of the main coil layer; and a plurality of shim trays for receiving passive shims, the shim trays being included in the second cooling layer, extended parallel to the axis of the main coil layer, and interposed between a corresponding pair of adjacent refrigerant flow paths.

14. A gradient magnetic field coil unit comprising:

a main coil layer that has a main coil for generating a gradient magnetic field and is formed in a substantially cylindrical shape;

a first cooling layer that is attached to the outside of the main coil layer and has a flow path for refrigerant, the flow path being buried in a spiral shape along an axis of the main coil layer;

a second cooling layer that is arranged on the outside of the first cooling layer and has a plurality of refrigerant flow paths extending parallel to the axis of the main coil layer;

a shield coil layer attached to the outside of the second cooling layer and having a shield coil for generating a magnetic field which shields a leakage magnetic field from the main coil; and a plurality of shim trays for receiving passive shims, the shim trays being included in the second cooling layer, main coil layer axis and interposed between a corresponding pair of adjacent refrigerant flow paths.

15. A gantry for MRI apparatus comprising:

a static magnetic field magnet that generates a static magnetic field and is formed in a substantially cylindrical shape about an axis;

a main coil layer that has a main coil for generating a gradient magnetic field and is formed in a substantially cylindrical shape;

a shield coil layer that is attached to the outside of the main coil layer and has a shield coil for generating a magnetic field which shields a leakage magnetic field from the main coil;

a cooling layer arranged between the main coil layer and the shield coil layer and including a plurality of refrigerant flow paths extending parallel to the main coil layer axis; and a plurality of shim trays for receiving passive shims, the shim trays being included in the cooling layer, extended parallel to the main coil layer axis, and interposed between a corresponding pair of adjacent refrigerant flow paths.

16. An MRI apparatus which obtains a magnetic resonance image related to a subject loaded in a gantry, wherein the gantry includes:

a static magnetic field magnet that generates a static magnetic field and is formed in a substantially cylindrical shape;

a main coil layer that has a main coil for generating a gradient magnetic field and is formed in a substantially cylindrical shape about an axis;

a shield coil layer that is attached to the outside of the main coil layer and has a shield coil for generating a magnetic field which shields a leakage magnetic field from the main coil;

a cooling layer arranged between the main coil layer and the shield coil layer and including a plurality of refrigerant flow paths extending parallel to the main coil layer axis; and a plurality of shim trays for receiving passive shims, the shim trays being included in the cooling layer, extended parallel to the axis of the main coil layer, and interposed between a corresponding pair of adjacent ones of the refrigerant flow paths.

* * * * *